(12) United States Patent
Mochizuki (10) Patent No.: US 8,467,427 B2
(45) Date of Patent: Jun. 18, 2013

(54) LIGHT EMITTING AND RECEIVING DEVICE

(75) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 180 days.

(21) Appl. No.: 12/694,525

(22) Filed: Jan. 27, 2010

(65) Prior Publication Data

US 2010/0189150 A1     Jul. 29, 2010

(30) Foreign Application Priority Data

Jan. 29, 2009   (JP) ................................. 2009-018307

(51) Int. Cl.
    *H01S 5/026*   (2006.01)
    *H01S 5/10*    (2006.01)
(52) U.S. Cl.
    USPC .................. 372/50.21; 372/43.01; 372/44.01; 372/93
(58) Field of Classification Search
    USPC ........................... 372/43.01, 44.01, 50.21, 93
    See application file for complete search history.

(56) References Cited

U.S. PATENT DOCUMENTS

| 4,470,143 | A | * | 9/1984 | Kitamura et al. | 372/50.21 |
| 5,088,105 | A | * | 2/1992 | Scifres et al. | 372/92 |
| 6,888,869 | B2 | | 5/2005 | Aoki | |
| 2009/0059990 | A1 | * | 3/2009 | Yatsuki et al. | 372/50.23 |

FOREIGN PATENT DOCUMENTS

| JP | 60-089990 | 5/1985 |
| JP | 62-268176 | 11/1987 |
| JP | 63-234585 | 9/1988 |
| JP | 03-228380 | 10/1991 |
| JP | 04-144182 | 5/1992 |
| JP | 08-162669 | 6/1996 |
| JP | 09-045996 | 2/1997 |
| JP | 10-003691 | 1/1998 |
| JP | 2001-124565 | 5/2001 |
| JP | 2003-046190 | 2/2003 |
| JP | 2004-296560 | 10/2004 |
| JP | 2005-228943 | 8/2005 |
| JP | 2007-273690 | 10/2007 |
| WO | WO2006104034 | * 5/2006 |

OTHER PUBLICATIONS

Oku, . "Fabrication and performance of AlGaAs-GaAs Distributed Bragg Reflector lasers and Distributed Feedback Lasers Utilizing First-Order Diffraction Gratings Formed by a Periodic Groove Structure," Jun. 1999, IEEE J. Selected Topics in QE, pp. 682-687.*

\* cited by examiner

*Primary Examiner* — Yuanda Zhang
*Assistant Examiner* — Michael Carter
(74) *Attorney, Agent, or Firm* — Harness, Dickey & Pierce, P.L.C.

(57) ABSTRACT

A device includes a semiconductor layer including first and second cladding layers sandwiching an active layer, a groove electrically separates receiving and emitting areas, an active layer part forms a continuous region between first and second end surfaces on a first side of the active layer, the gain region has a reflection surface between the first and second end surfaces reflecting gain region generated light, a first gain region portion extending from the first end surface and a second gain region portion extending from the second end surface are tilted, some light from the first portion is reflected to be emitted from the second end surface, some light from the second portion is reflected to be emitted from the first end surface, and some light transmits through a mirror portion of the reflection surface and is received in the receiving area.

15 Claims, 9 Drawing Sheets

LIGHT EMITTING AND RECEIVING DEVICE

This application claims priority to Japanese Patent Application No. 2009-018307 filed on Jan. 29, 2009. The entire disclosure of Japanese Patent Application No. 2009-018307 is hereby incorporated herein by reference.

BACKGROUND

1. Technical Field

The present invention relates to a light emitting and receiving device.

2. Related Art

In semiconductor light emitting devices used in optical communications or the like, generally, a semi-transmissive mirror or a diffractive element is disposed outside of the devices so as to extract part of the emitted light. Then, adjustment of the intensity of the emitted light or the like is performed by detecting the extracted light by using a light receiving device.

For example, in JP-A-10-3691, an optical pickup device that branches light emitted from a laser diode through a spectral prism or the like and has a monitoring photo diode for detecting the branched light is proposed.

Meanwhile, recently, as a light emitting device used for a light source of a display device such as a projector, a display, or the like, a laser device having excellent color reproducibility with high luminance has been demanded. However, when a laser diode is used in a display device, there are cases where sufficient luminance cannot be acquired without using a plurality of laser diodes. In such a display device, in order to reduce the unevenness of luminance, the intensity of light of the light emitting device needs to be detected, and the intensity of light needs to be adjusted.

However, in the above-described method disclosed in JP-A-10-3691 or the like, a light emitting device and a light receiving device are separately arranged. Thus, additionally, an optical element such as a spectral prism or the like is necessary. Accordingly, the number of components is increased, and miniaturization of the device cannot be easily achieved. In addition, there is a problem that light receiving elements cannot be individually arranged easily although the intensity of light of each of the laser diodes needs to be detected for applying the above-described method in a display device. In addition, when a laser diode is used in a light emitting device, speckle noise, which is generated by mutual interference of scattered light on a screen surface, may cause a problem. In order to reduce speckle noise, as a light emitting device, using a general LED (Light Emitting Diode) may be considered. However, there are some cases where sufficient output power cannot be obtained from an LED.

SUMMARY

An advantage of some aspects of the invention is that it provides a light emitting and receiving device, that a light emitting device and a light receiving device can be monolithically integrated, and that the intensity of light can be individually detected.

Another advantage of some aspects of the invention is that it provides a noble light emitting and receiving device that can reduce speckle noise and implement high output power.

According to an aspect of the invention, a light emitting and receiving device is provided. The light emitting and receiving device has a semiconductor layer including: a first cladding layer; an active layer that is formed on an upper side of the first cladding layer; and a second cladding layer that is formed on an upper side of the active layer. In the semiconductor layer, a light receiving area is electrically separated from a light emitting area by a separation groove, and at least a part of the active layer that is located in the light emitting area compose a gain region. In addition, the gain region is continuous from a first end surface disposed on a first side surface of the active layer that is located in the light emitting area to a second end surface disposed on the first side surface, and the gain region has a reflection surface, which reflects light generated in the gain region, between the first end surface and the second end surface. A mirror portion is arranged on the reflection surface, and both a first portion of the gain region that extends from the first end surface and a second portion of the gain region that extends from the second end surface is disposed in a direction tilted respect to a perpendicular line of the first side surface in the plan view. Part of light generated in the first portion of the gain region is reflected from the reflection surface so as to be emitted from the second end surface. In addition, part of light generated in the second portion of the gain region is reflected from the reflection surface so as to be emitted from the first end surface, and part of the light generated in the gain region transmits through the mirror portion arranged on the reflection surface. The light transmitting through the mirror portion is received in the light receiving area of the semiconductor layer.

According to the above-described light emitting and receiving device, the light emitting device and the light receiving device can be integrated monolithically, and the intensity of light can be individually detected. In addition, according to the above-described light emitting and receiving device, a noble light emitting and receiving device that can reduce speckle noise and have a high output power can be provided.

In descriptions here, a phrase of the "upper side" is used, for example, as in "a specific member (hereinafter, referred to as a "B member") that is formed on the "upper side" of another "specific member" (hereinafter referred to as an "A member")" or the like. In description here, in such an example, the phrase of the "upper side" is used so as to include a case where the B member is directly formed on the A member and a case where the B member is formed above the A member through another member.

In the above-described light emitting and receiving device, the mirror portion may consist of a distributed Bragg reflector or a photonic crystal region.

In the above-described light emitting and receiving device, the distributed Bragg reflector may be composed of a plurality of grooves, and the plurality of grooves can be formed at a predetermined interval in a direction perpendicular to the reflection surface.

In the above-described light emitting and receiving device, at least one of the plurality of grooves may also work as the separation groove.

In the above-described light emitting and receiving device, the photonic crystal region may be composed of a plurality of holes that are periodically arranged in a predetermined lattice constant in an in-plane direction of the active layer.

In the above-described light emitting and receiving device, the first portion of the gain region can be disposed from the first end surface to the reflection surface in the first direction, and the second portion of the gain region can be disposed from the second end surface to the reflection surface in a direction different from the first direction, and both end surface of the first the second portion can overlap each other on the reflection surface.

In the above-described light emitting and receiving device, each of the end surface of the first and the second portion that is located on the first side-surface side and an end surface of the reflection surface may not overlap each other in the plan view viewed from the first side-surface side.

In the above-described light emitting and receiving device, the separation groove can be disposed between the light emitting area and the light receiving area in the plan view, and the position of a bottom surface of the separation groove can be located below the position of the bottom surface of the active layer.

In the above-described light emitting and receiving device, the light emitting area may have: a first electrode that is electrically connected to the first cladding layer; a second electrode that is electrically connected to the second cladding layer. In such a case, the light receiving area may have: a third electrode that is electrically connected to the first cladding layer; and a fourth electrode that is electrically connected to the second cladding layer.

In addition, in descriptions here, the phrase "electrically connected", for example, is used as in "a specific member (hereinafter, referred to as a "D member") that is "electrically connected" to another specific member (hereinafter, referred to as a "C member")" or the like. In descriptions here, in such an example, the phrase "electrically connected" is used so as to include a case where the C member and the D member are directly brought into contact with each other so as to be electrically connected to each other and a case where the C member and the D member are electrically connected to each other through another member.

In the above-described light emitting and receiving device, the first and the third electrode may be a common electrode.

In the above-described light emitting and receiving device, a plurality of the light emitting areas and a plurality of the light receiving areas may be arranged.

In the above-described light emitting and receiving device, a plurality of the light emitting areas and a single light receiving area may be arranged.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the accompanying drawings.

1. Light Emitting and Receiving Device

First, a light emitting and receiving device 1000 according to an embodiment of the invention will be described.

Figure 1:
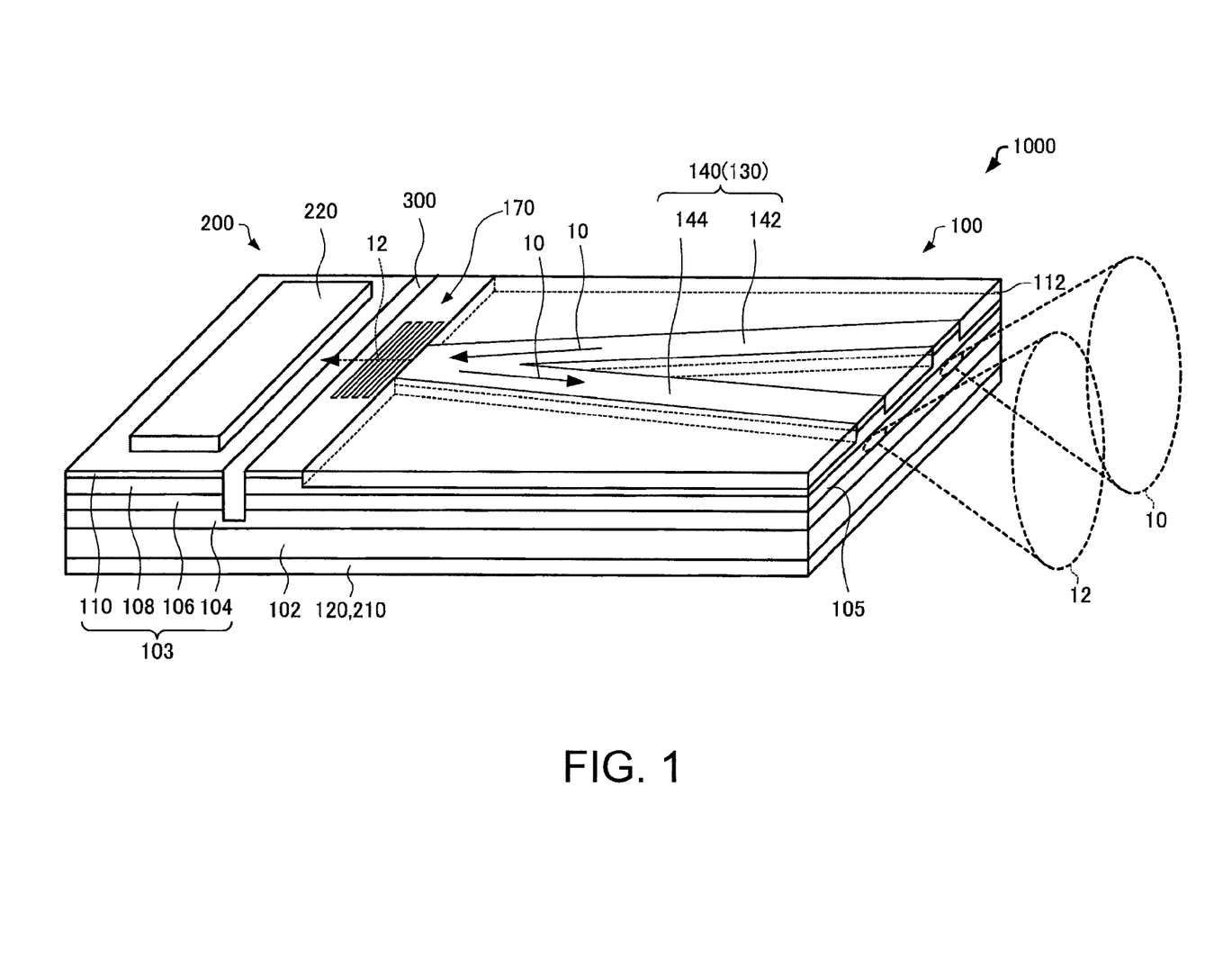
FIG. 1 is a schematic perspective view of a light emitting and receiving device according to an embodiment of the invention.
Figure 2:
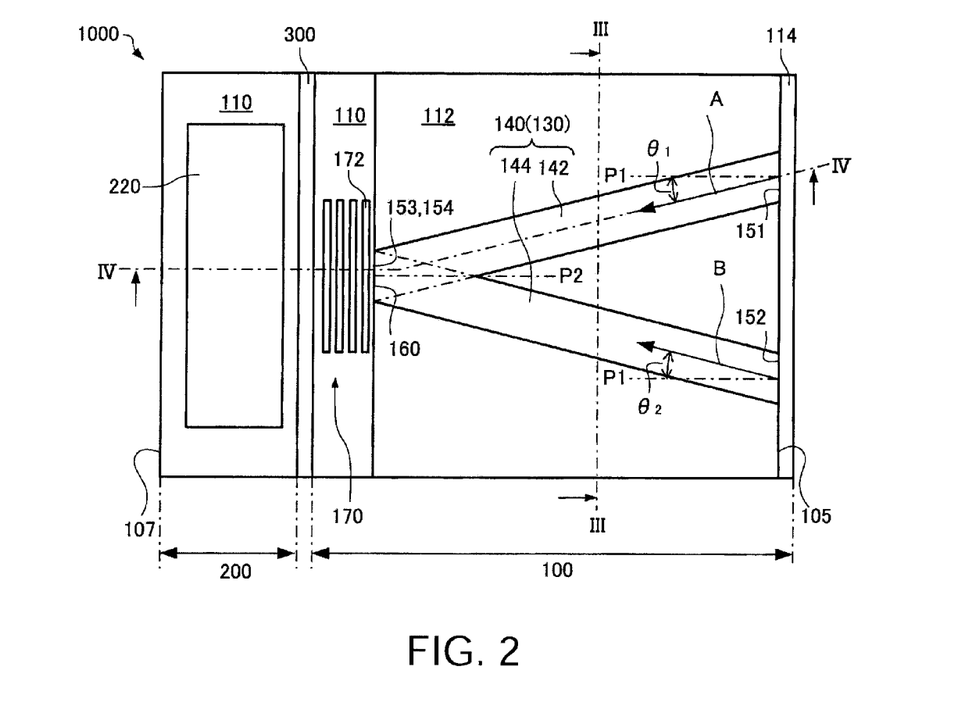
FIG. 2 is a schematic plan view of the light emitting and receiving device according to the embodiment.
Figure 3:
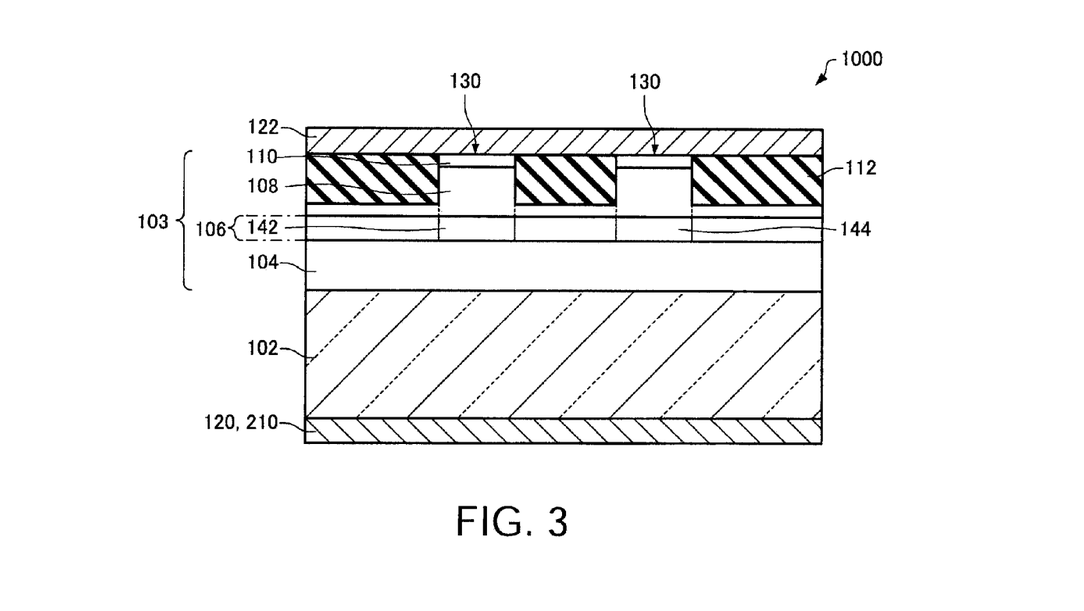
FIG. 3 is a schematic cross-sectional view of the light emitting and receiving device according to the embodiment.
Figure 4:
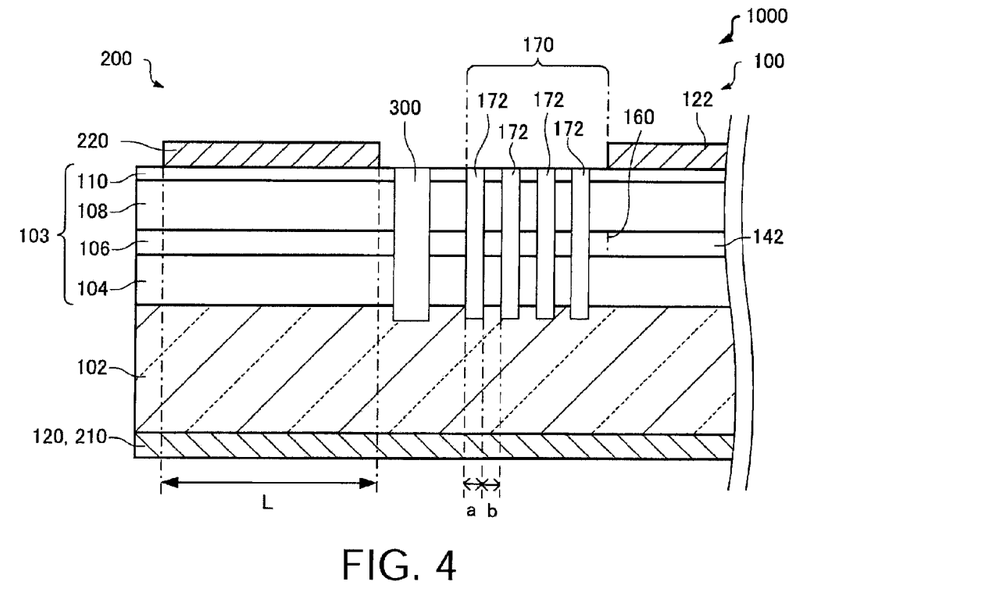
FIG. 4 is a schematic cross-sectional view of the light emitting and receiving device according to the embodiment.

FIG. 1 is a schematic perspective view of the light emitting and receiving device 1000. FIG. 2 is a schematic plan view of the light emitting and receiving device 1000. FIG. 3 is a cross-sectional view taken along line III-III shown in FIG. 2. FIG. 4 is a cross-sectional view taken along line IV-IV shown in FIG. 2. In FIG. 1, for convenience of drawing, a second electrode 122 and an anti-reflection coating 114 are omitted. In FIG. 2, the second electrode 122 is omitted for convenience of drawing. In addition, here, an example that the light emitting and receiving device 1000 is a semiconductor device of AlInGaP types (red color) will be described.

The light emitting and receiving device 1000, as shown in FIGS. 1 to 4, has a semiconductor layer 103 that includes a first cladding layer 104, an active layer 106, and a second cladding layer 108. The light emitting and receiving device 1000, for example, may also include a substrate 102, an insulating portion 112, an anti-reflection coating 114, a first electrode 120, a second electrode 122, and a mirror portion 170.

As the substrate 102, for example, a first conduction-type (for example, the n type) GaAs substrate or the like may be used.

The semiconductor layer 103 is formed on the substrate 102. The semiconductor layer 103 has the first cladding layer 104, the active layer 106, and the second cladding layer 108. The semiconductor layer 103, for example, may also include a contact layer 110.

The first cladding layer 104 is formed on the substrate 102. The first cladding layer 104, for example, is formed of a first conduction-type semiconductor. As the first cladding layer 104, for example, an n-type AlInGaP layer or the like may be used. Although not shown in the figure, a buffer layer may be formed between the substrate 102 and the first cladding layer 104. As the buffer layer, for example, a GaAs layer, an InGaP layer, or the like of a first conductive-type (n type) having crystallinity better than that of the substrate 102 (for example, low defect density) may be used.

The active layer 106 is formed on the first cladding layer 104. The active layer 106 has a multiple quantum well (MQW) structure formed by, for example, three quantum well structures each contains an InGaP well layer and an AlInGaP barrier layer. The shape of the active layer 106 is, for example, a rectangular parallelepiped (including a cube) or the like. The active layer 106 has a first side surface 105 on a light emitting area 100 side and a second side surface 107 on a light receiving area 200 side. The first side surface 105 and the second side surface 107 are, for example, parallel to each other.

The second cladding layer 108 is formed on the active layer 106. The second cladding layer 108, for example, is formed from a second conduction-type (for example, the p type) semiconductor. As the second cladding layer 108, for example, the p-type AlInGaP layer or the like may be used.

As shown in FIG. 3, the contact layer 110 may be formed on the second cladding layer 108. As the contact layer 110, a layer that is in ohmic contact with the second layer 122 may be used. The contact layer 110 is, for example, formed from a second conduction-type semiconductor. As the contact layer 110, for example, a p-type GaAs layer or the like may be used.

In the semiconductor layer 103, for example, a pin diode is formed by the p-type second cladding layer 108, the active layer 106 in which any impurity is not doped, and the n-type first cladding layer 104. Both the first and the second cladding layer 104 and 108 are layers that have a forbidden band gap greater than that of the active layer 106 and a refractive index smaller than that of the active layer 106.

In the semiconductor layer 103, the light receiving area 200 is electrically separated from the light emitting area 100 by a separation groove 300.

First, the light emitting area 100 will be described.

In the light emitting area 100, when a forward bias for the pin diode is applied between the first electrode 120 and the second electrode 122, recombination of electrons and holes occurs in a gain region 140 of the active layer 106 of the light emitting area 100. Accordingly, light is emitted in accordance with the recombination. Originating form the generated light, stimulated emission occurs and the intensity of light is amplified within the gain region 140. Part of the light generated in the gain region 140 is emitted from a first end surface 151 and a second end surface 152. Thus, the light emitting area 100 can realize a light emitting device.

A part of the active layer 106 of the light emitting area 100 forms the gain region 140. This gain region 140 can generate light, and the light can be amplified within the gain region 140. The gain region 140 is a continuous region extending from the first end surface 151 disposed on the first side surface 105 of the active layer 106 to the second end surface 152 disposed on the first side surface 105. In addition, the gain region 140 has a reflection surface 160 that is disposed between the first and the second end surface 151 and 152 and reflects the light generated in the gain region 140. There may be one or a plurality of reflection surfaces 160. The gain region 140 may have a first portion 142 extending from the first end surface 151 and a second portion 144 extending from the second end surface 152. In the example shown in the figure, the gain region 140 is composed of the first portion 142 and the second portion 144. However, the gain region 140 may have a portion other than the above-described portions.

The first portion 142 has the first end surface 151 that is disposed on the first side surface 105 and a third end surface 153 that composes the reflection surface 160. The second portion 144 has the second end surface 152 that is disposed on the first side surface 105 and a fourth end surface 154 that composes the reflection surface 160. As shown in FIG. 2, each of the first and second portions 142 and 144 of the gain region 140 extends from the first side surface 105 to the reflection surface 160 in a direction tilted with respect to the perpendicular line P1 of the first side surface 105 in the plan view. Accordingly, laser oscillation of light generated in the gain region 140 can be suppressed or prevented. The first portion 142 and the second portion 144 extend toward different directions. In the example shown in the figure, the first portion 142 extends to one direction A tilted by an angle $\theta_1$ with respect to the perpendicular line P1. On the other hand, the second portion 144 extends to a different direction B tilted by an angle $\theta_2$ with respect to the perpendicular line P1. Here, a case that the first portion 142 extends to one direction represents a case that the one direction coincides with a direction connecting the center of the first end surface 151 of the first portion 142 to the center of the third end surface 153 of the reflection surface 160 side in the plan view. This also applies to other parts. In the example shown in the figure, the size of the angle $\theta_1$ of the first portion 142 with respect to the perpendicular line P1 and the size of the angle $\theta_2$ of the second portion 144 with respect to the perpendicular line P1 are the same, although the tilting directions of the angles $\theta_1$ and $\theta_2$ are different. However, the size of the angles may be configured to be different from each other. The planar shapes of the first portion 142 and the second portion 144 are, for example, parallelograms.

Figure 5:
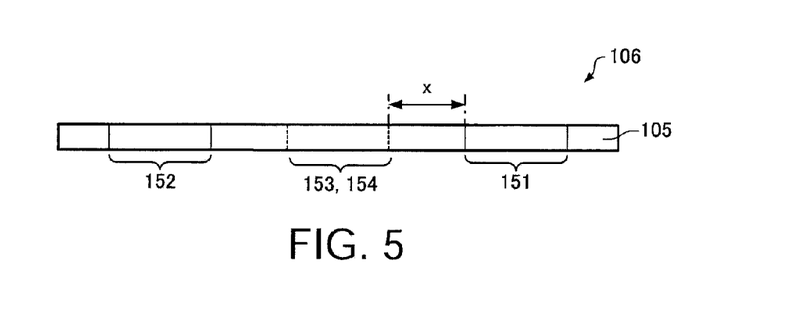
FIG. 5 is a diagram of an active layer according to the embodiment, viewed from a first side-surface side in the plan view.

FIG. 5 is a plan view of the active layer 106 viewed from the first side surface 105 side. As shown in FIG. 5, the first end surface 151 and the third end surface 153 of the first portion 142 do not overlap each other. Similarly, the second end surface 152 and the fourth end surface 154 of the second portion 144 also do not overlap each other. Accordingly, light that is generated in the first portion 142 can not cause direct multiple reflection between the first end surface 151 and the third end surface 153, and light generated in the second portion 144 can not cause direct multiple reflection between the second end surface 152 and the fourth end surface 154. As a result, a resonator can not be formed, and accordingly, laser oscillation of the light generated in the gain region 140 can be suppressed or prevented more assuredly. Accordingly, the light emitting device can emit light other than a laser beam. In order to realize this, as shown in FIG. 5, for example, a deviation x between the first and third end surfaces 151 and 153 of the first portion 142 should have any positive value.

The reflection surface 160 is composed of the third end surface 153 of the first portion 142 and the fourth end surface 154 of the second portion 144. In the example shown in the figure, the third end surface 153 and the fourth end surface 154 completely overlap each other, and the reflection surface 160 is a surface that coincides with the third and the fourth end surfaces 153 and 154. Although not shown in the figure, it is also possible that the third end surface 153 and the fourth end surface 154 partially overlap each other. In the example shown in FIG. 2, the reflection surface 160 may be parallel to the first side surface 105 in the plan view. On the reflection surface 160, a mirror portion 170 is disposed. In the example shown in FIG. 2, the mirror portion 170, is a distributed Bragg reflector (hereinafter, referred to as a DBR) 170. Accordingly, the reflection surface 160 can have high reflectivity.

For the wavelength range of the light generated in the gain region 140, the reflectivity of the reflection surface 160 is higher than those of the first end surface 151 and the second end surface 152. On the first end surface 151 and the second end surface 152, for example, an anti-reflection coating 114 is disposed, by which low reflectivity can be acquired. The anti-reflection coating 114 may be disposed on the entire surface of the first side surface 105. As the anti-reflection coating 114, for example, an Al$_2$O$_3$ single layer or a SiO$_2$ layer, a SiN layer, a SiON layer, a TiO$_2$ layer, a TiN layer, a Ta$_2$O$_5$ layer, a multilayer thereof, or the like may be used. The reflection surface 160 may have high reflectivity by disposing the DBR 170.

The DBR 170 can be formed by a plurality of grooves 172. The planar shape of the groove 172 is, for example, a rectangle. The position of the bottom surface of the groove 172 is preferably below the position of the lower surface of the active layer 106. In the example shown in FIG. 4, the position of the bottom surface of the groove 172 is located below the position of the top surface of the substrate 102. The inside of the groove 172 may be a hollow space or filled up with an insulating material. Although four grooves 172 are drawn in the example shown in the figure, the number of the grooves is not particularly limited. The reflectivity of the DBR 170 can be adjusted by changing the number of the grooves 172 and the position (the depth of the grooves) of the bottom surface. In particular, by increasing the number of the grooves 172, the reflectivity becomes high. On the other hand, by decreasing the number of the grooves 172, the reflectivity becomes low. In addition, by increasing the depth of the grooves 172, the reflectivity becomes high. On the other hand, by decreasing the depth of the grooves 172, the reflectivity becomes low. Accordingly, the intensity of light 12 which incidents to the light receiving area 200 described later can be adjusted.

The grooves 172 are formed in the perpendicular direction P2 of the reflection surface 160 at a predetermined interval. The grooves 172, as shown in FIG. 4, may be disposed to have the width a of $(2m_a+1)\lambda/(4n_a \cos \theta_1')$ or $(2m_a+1)\lambda/(4n_a \cos \theta_2')$ and the interval b of $(2m+1)\lambda/(4n \cos \theta_1)$ or $(2m+1)\lambda/(4n \cos \theta_2)$. Here, $m_a$ and $m_b$ are integers equal to or greater than zero, $\lambda$ is a wavelength of the light generated in the gain region 140, $n_a$ is an effective refractive index of the vertical section of the groove 172, and $n_b$ is an effective refractive index of the vertical section in which the groove 172 is not formed. The angle $\theta_1'$ and $\theta_2'$ are refraction angles, when light incidents to the first reflection surface 160 at the angle of $\theta_1$ or $\theta_2$ from the gain region 140, and thus $\theta_1'=\sin^{-1}((n_b/n_a) \sin \theta_1)$ and $\theta_2'=\sin^{-1}((n_b/n_a) \sin \theta_2)$. As described above, by introducing the grooves 172 having a predetermined width at a predetermined interval, the DBR 170 can be realized.

The contact layer 110 of the light emitting area 100 and a part of the second cladding layer 108 of the light emitting area 100 may form a columnar semiconductor region (hereinafter, referred to as a columnar region) 130. The contact layer 110 of the light emitting area 100 may have the same planar shape as that of the gain region 140. In other words, in the light emitting area 100, a current path between the electrodes 120 and 122 is, for example determined in accordance with the planar shape of the columnar region 130, by which the planar shape of the gain region 140 is determined. Although not shown in the figure, a part of the semiconductor layer 103 of the light emitting area 100 may also form the columnar region 130.

The insulating portion 112 may be disposed, for example, above the second cladding layer 108 of the light emitting area 100 and on the side of the columnar region 130, as shown in FIGS. 1 and 3. The insulating portion 112 is in contact with the side surface of the columnar region 130. The top surface of the insulating portion 112 may be formed to be continuous to the top surface of the contact layer 110. As the insulating portion 112, for example, a SiN layer, a SiO$_2$ layer, a polyimide layer, or the like may be used. When such a material is used as the insulating portion 112, a current between the first electrode 120 and the second electrode 122 can flow to the columnar region 130 interposed between the insulating portions 112 by avoiding the insulating portion 112. In the example shown in FIG. 2, the insulating portion 112 may be disposed in an area excluding the columnar region 130 from an area in which the second electrode 122 is formed, in a plan view.

The insulating portion 112, although not shown in the figure, may cover the side surfaces of the active layer 106 of the light emitting area 100 other than the surfaces form the first end surface 151 to the fourth end surface 154. The insulating portion 112 may have a refractive index lower than that of the active layer 106 and the first and the second cladding layers 104 and 108. In such a case, the effective refractive index of the vertical section in which the insulating portion 112 is formed is lower than that of the vertical section in which the insulating portion 112 is not formed, that is, a portion in which the columnar region 130 is formed. Accordingly, light can be effectively confined within the gain region 140 in the planar direction. Alternatively, the insulating portion 112 may not be disposed. For example, the insulating portion 112 may be air. In such a case, the columnar region 130 may be formed so as not to include the active layer 106 and the first cladding layer 104. In addition, the second electrode 122 to be described later may be formed not to be in direct contact with the active layer 106 and the first cladding layer 104.

The first electrode 120 may be formed below the substrate 102. In the example shown in FIG. 1, the first electrode 120 is an electrode that is commonly used as a third electrode 210 and is formed on the entire surface under the substrate 102. The first electrode 120 may be formed to be in contact with a layer (the substrate 102 in the example shown in the figure) that is in ohmic contact with the first electrode 120. The first electrode 120 is electrically connected to the first cladding layer 104 of the light emitting area 100 through the substrate 102. The first electrode 120 is one electrode that is used for driving the light emitting device. As the first electrode 120, for example, an electrode formed by stacking a Cr layer, a AuGe layer, a Ni layer, and a Au layer in that order from the substrate 102 side may be used.

The second electrode 122 may be formed in the entire surface positioned on the contact layer 110 and the insulating portion 112 of the light emitting area 100. The second electrode 122 is electrically connected to the second cladding layer 108 of the light emitting area 100 through the contact layer 110 of the light emitting area 100. The second electrode 122 is the other electrode that is used for driving the light emitting device. As the second electrode 122, for example, an electrode formed by stacking a Cr layer, a AuZn layer, and a Au layer in that order from the contact layer 110 side may be used. A contact face of the second electrode 122 and the contact layer 110 of the light emitting area 100 may have the same planar shape as that of the gain region 140.

Next, the light receiving area 200 will be described.

In the light receiving area 200 of the semiconductor layer 103, when a reverse bias of the pin diode is applied between the third electrode 210 and a fourth electrode 220, electron-hole pairs generated by the incident light are accelerated and can be extracted as a current. In other words, the light receiving area 200 may form the pin photo diode working as the light receiving device.

The third electrode 210 may be formed under the substrate 102. The third electrode 210, in the example shown in the figure, is commonly used as the first electrode 120. The third electrode 210 is one electrode that is used for driving the light receiving device. The third electrode 210 is electrically connected to the first cladding layer 104 of the light receiving area 200 through the substrate 102. As a material of the third electrode 210, for example, the same material as that of the first electrode 120 may be used.

The fourth electrode 220, as shown in FIG. 1, is formed on the contact layer 110 of the light receiving area 200. The fourth electrode 220 is the other electrode that is used for driving the light receiving device. The fourth electrode 220 is electrically connected to the second cladding layer 108 of the light receiving area 200 through the contact layer 110 of the light receiving area 200. In the example shown in the figure, the fourth electrode 220 determines an area that works substantially as a pin photo diode.

Next, the separation groove 300 will be described.

The separation groove 300 can electrically separate the light emitting area 100 and the light receiving area 200 from each other. The separation groove 300, as shown in FIG. 1, may be disposed between the light emitting area 100 and the light receiving area 200 in the plan view. The position of the bottom surface of the separation groove 300 may be located below the position of the bottom surface of the active layer 106. In the example shown in FIG. 4, the position of the bottom surface of the separation groove 300 is located below the position of the top surface of the first cladding layer 104.

The length L between the surface on the light receiving area side of the separation groove 300 and the second side surface 107, for example, may be $(2m_c+1)\lambda/4n_c$. Here, $m_c$ is an integer equal to or greater than zero, $\lambda$ is a wavelength of light generated in the gain region 140, and $n_c$ is an effective refractive index of the vertical section of the light receiving area 200. Accordingly, formation of a resonator can be prevented in the light receiving area 200. In the light receiving area 200, when a resonator is formed, light emitted from the resonator to the gain region 140 and light 10 reflected from the reflection surface 160 may cancel out, and thus the substantial reflectivity of the reflection surface 160 may decrease. By setting the length L as described above, such a phenomenon can be prevented.

Next, the operation of the light emitting and receiving device 1000 will be described.

In the light emitting area 100 of the semiconductor layer 103, when a forward bias for the pin diode is applied between the first electrode 120 and the second electrode 122, recombination of electrons and holes occurs in the gain region 140. Accordingly, light is emitted in accordance with the recombination. Originating form the generated light, stimulated emission occurs and the intensity of light is amplified within the gain region 140. For example, as shown in FIG. 1, when part of the light 10 generated in the first portion 142 of the gain region 140 is reflected from the reflection surface 160 and is emitted from the second end surface 152 as the light 12, the intensity of the light is amplified while propagating through the first and the second portion 142 and 144. Similarly, when part of the light generated in the second portion 144 is reflected from the reflection surface 160 and is emitted from the first end surface 151 as the light 10, the intensity of the light is amplified while propagating through the first and the second portion 142 and 144. In addition, part of the light generated in the first portion 142 is directly emitted from the first end surface 151 as the light 10. Similarly, part of the light generated in the second portion 144 is directly emitted from the second end surface 152 as the light 12. The above-described light is also amplified while propagating each gain region. In addition, part of the light generated in the gain region 140 becomes the light 14 that transmits through the reflection surface 160. The light 14 propagates inside the light emitting and receiving device 1000 up to the light receiving area 200.

In the light receiving area 200 of the semiconductor layer 103, when a reverse bias of the pin diode is applied between the third electrode 210 and the fourth electrode 220, electron-hole pairs generated by the light 14 propagating the light receiving area 200 are accelerated and can be extracted as a current. Accordingly, a current corresponding to the intensity of the light 14 flows between the third electrode 210 and the fourth electrode 220. By detecting the current, the intensity of the light 14, which relates to the output power of the light emitting area 100, in other words, the intensity of the light 10 and 12, can be monitored.

For example, the light emitting and receiving device 1000 according to this embodiment can be used as a light source of a projector, a display, an illumination device, a measurement device, or the like. This also applies to embodiments of the invention to be described later.

The light emitting and receiving device 1000 has, for example, the following aspects.

In the light emitting and receiving device 1000 according to this embodiment, the light emitting area 100 and the light receiving area 200 can be formed monolithically. In other words, the light emitting device and the light emitting device of the light emitting and receiving device 1000 can be integrated monolithically. Accordingly, as described later, forming an array of the light emitting and receiving devices can be performed easily. In addition, compared to a case where the light receiving device is individually formed, the number of the components can be decreased, and the manufacturing costs can be reduced.

According to the light emitting and receiving device 1000 of this embodiment, the intensity of the light 14, which relates to the output power of the light emitting area 100, can be monitored in the light receiving area 200. Accordingly, a voltage applied to the light emitting area 100 can be adjusted based on the intensity of the monitored light. As a result, a light emitting and receiving device capable of reducing unevenness of luminance and automatically adjusting the brightness can be provided. The detailed feedback operation for adjusting the output power of the light emitting area 100 can be realized, for example, by controlling the voltage applied to the light emitting area 100 by using an external electronic circuit (not shown).

According to the light emitting and receiving device 1000 of this embodiment, as described above, laser oscillation of the light generated in the gain region 140 can be suppressed or prevented. Accordingly, speckle noise can be reduced. In addition, according to the light emitting and receiving device 1000 of this embodiment, the intensity of the light generated in the gain region 140 can be amplified within the gain region 140 and be emitted to outside. Therefore, an output power higher than that of a general LED can be obtained. As described above, according to this embodiment, a noble light emitting and receiving device that can reduce speckle noise and have a high-output power can be provided.

In the light emitting and receiving device 1000 of this embodiment, the DBR 170 composed of a plurality of grooves 172 can be disposed on the reflection surface 160. Accordingly, the DBR 170 can be manufactured in a planar process, and thus the light receiving area can be formed monolithically. In addition, compared to a case where formation of a dielectric mirror or cleavage is performed for each chip, the amount of resources used can be reduced while the productivity is improved. In addition, according to the light emitting and receiving device 1000, the reflectivity of the DBR 170 can be adjusted easily. Accordingly, the intensity of the light 14 that incidents to the light receiving area 200 can more closely be related to the output power of the light emitting area 100, and thus the output power can more precisely be adjusted by monitoring the intensity of the light 14.

In the example shown in the first embodiment, the gain region means current route which electric current avoids the insulating part and flows from the first cladding layer to the second cladding layer through the active layer. To put it in other words, the light emitting and receiving device comprising:

a semiconductor layer, an active layer formed between a first cladding layer and a second cladding layer, insulating part regulating the current flow;

wherein a light receiving area is electrically separated from a light emitting area by a separation groove, at least apart of the active layer constitutes a current route defined by electric current avoids the insulating part and flows from the first cladding layer to the second cladding layer through the active layer, the current route composed of a first portion, a second portion and a reflection surface, the first portion extends from a first end surface disposed on a first side surface of the active layer to the reflection surface, the second portion extends from a second end surface disposed on a first side surface of the active layer to the reflection surface, a mirror portion is arranged on the reflection surface, a part of light generated in the first portion is reflected by the reflection surface so as to be emitted from the second end surface through the second portion, a part of light generated in the second portion is reflected by the reflection surface so as to be emitted from the first end surface through the first portion, a part of the light generated in the both of the first portion and the second portion is transmitted through the mirror portion, and the light transmitting through the mirror portion is received in the light receiving area of the semiconductor layer.

2. Method of Manufacturing Light Emitting and Receiving Device

Next, a method of manufacturing the light emitting and receiving device 1000 according to this embodiment will be described with reference to the accompanying drawings.

Figure 6:
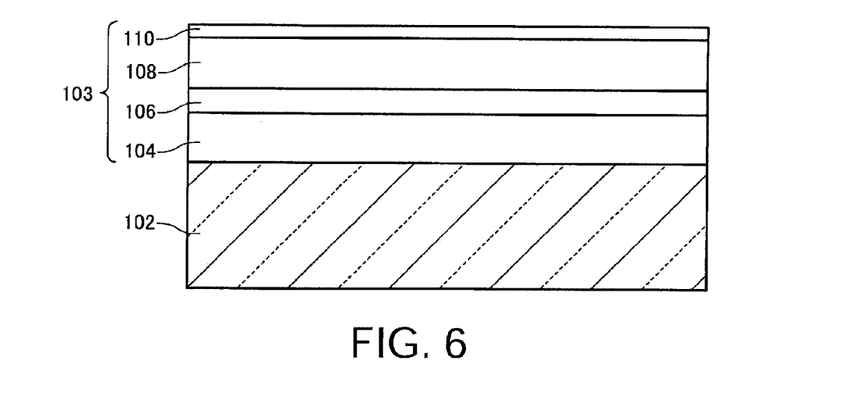
FIG. 6 is a schematic cross-sectional view showing a process of manufacturing the light emitting and receiving device according to the embodiment.
Figure 7:
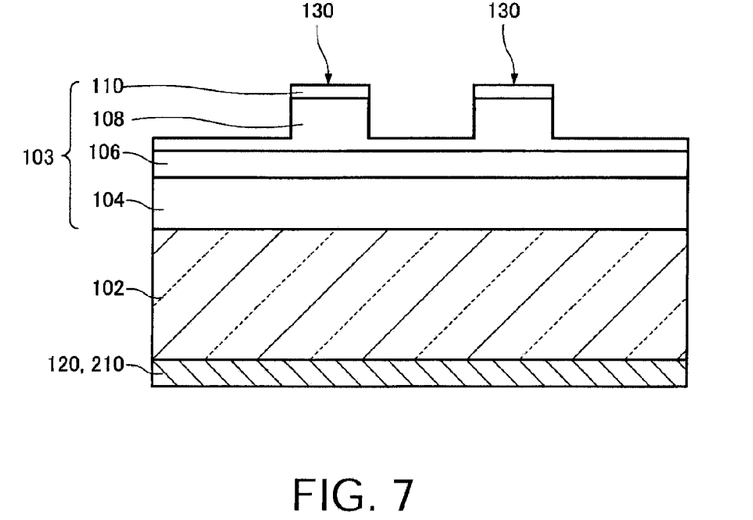
FIG. 7 is a schematic cross-sectional view showing a process of manufacturing the light emitting and receiving device according to the embodiment.
Figure 8:
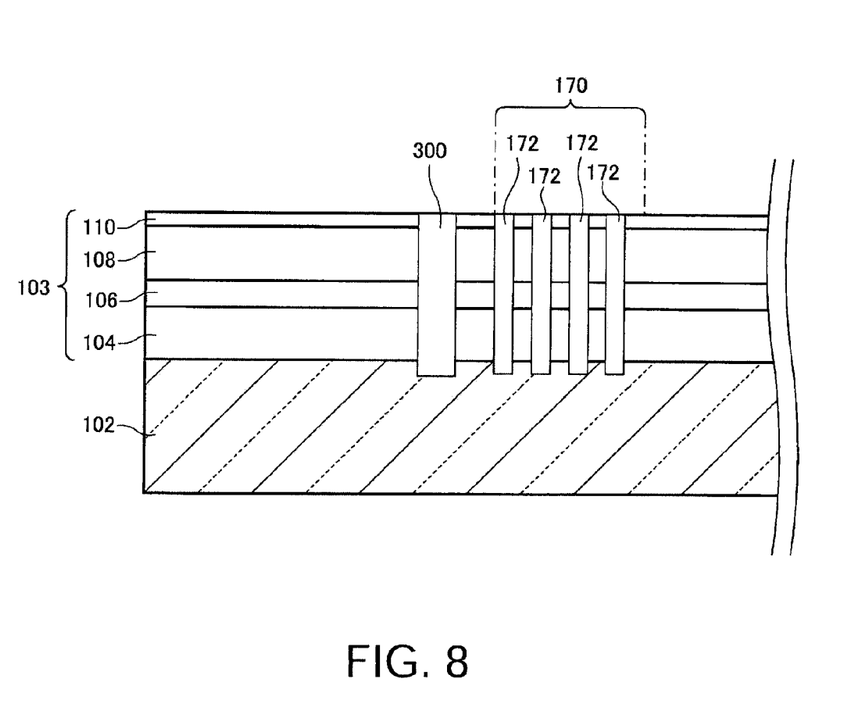
FIG. 8 is a schematic cross-sectional view showing a process of manufacturing the light emitting and receiving device according to the embodiment.

FIGS. 6 to 8 are schematic cross-sectional views showing a process of manufacturing the light emitting and receiving device 1000. FIGS. 6 and 7 correspond to the cross-sectional view shown in FIG. 3. FIG. 8 corresponds to a cross-sectional view shown in FIG. 4.

First, as shown in FIG. 6, the first cladding layer 104, the active layer 106, the second cladding layer 108, and the contact layer 110 are epitaxially grown in that order on the substrate 102. As a method for performing epitaxial growth, for example, an MOCVD (Metal-Organic Chemical Vapor Deposition) method, an MBE (Molecular Beam Epitaxy) method, or the like may be used.

Next, as shown in FIG. 7, the contact layer 110 of the light emitting area 100 and the second cladding layer 108 of the light emitting area 100 are patterned. The patterning process is performed, for example, by using photolithographic technology, etching technology, or the like. Accordingly, the columnar regions 130 are formed.

Next, as shown in FIG. 8, the grooves 172 and the separation groove 300 are formed by patterning the contact layer 110, the second cladding layer 108, the active layer 106, the first cladding layer 104, and the substrate 102. The etching process is performed similarly to the process shown in FIG. 7. Accordingly, the DBR 170 that is composed of the grooves 172 and the separation groove 300 are formed.

Next, as shown in FIG. 3, the insulating portion 112 is formed so as to cover the side surfaces of the columnar regions 130. In particular, first, an insulating layer (not shown) is deposited on the upper side (including the contact layer 110) of the second cladding layer 108, for example, by using a CVD (Chemical Vapor Deposition) method, a coating method, or the like. Next, the top surface of the contact layer 110 is exposed, for example, by using etching technology or the like. The insulating portion 112 can be formed by applying the above-described process. In this process, the grooves 172 and the separation groove 300 can also be filled up with the insulating layer. Alternatively, for example, by covering the areas of the grooves 172 with a resist film (not shown) or the like, the grooves 172 may not be filled up with the insulating layer.

Next, as shown in FIG. 3, the second electrode 122 is formed on the insulating portion 112 and the contact layer 110 of the columnar region 130, and the fourth electrode 220 is formed on the contact layer 110 of the light receiving area 200. The second electrode 122 and the fourth electrode 220 can be formed in desired shapes by covering a predetermined area with a resist film (not shown) or the like, for example, by using photolithographic technology and then performing a vacuum deposition method and a lift-off technique. In this process, it is preferable that an area larger than the groove 172 is covered, for example, with a resist film or the like, so that the area, in which the DBR 170 is formed, does not form a short circuit due to insertion of an electrode material into the groove 172.

Next, on the bottom surface of the substrate 102, the first electrode 120 and the third electrode 210 are formed. The method for forming the first electrode 120 and the third electrode 210 is, for example, the same as the above-described example of the method for forming the second electrode 122 and the fourth electrode 220. The formation order of the first electrode 120, the third electrode 210, the second electrode 122, and the fourth electrode 220 is not particularly limited.

Next, as shown in FIG. 2, the anti-reflection coating 114 is formed on the entire surface of the first side surface 105. The anti-reflection coating 114 is formed, for example, by using a CVD (Chemical Vapor Deposition) method, a sputtering method, an ion assisted deposition method, or the like.

The light emitting and receiving device 1000 can be manufactured by applying the above-described process.

3. Modified Examples

Next, modified examples of the light emitting and receiving device according to this embodiment will be described. Here, differences between the modified examples and the above-described example of the light emitting and receiving device 1000 shown in FIGS. 1 to 4 will be described, and common aspects will not be described.

(1) First, a First Modified Example will be Described.

Figure 9:
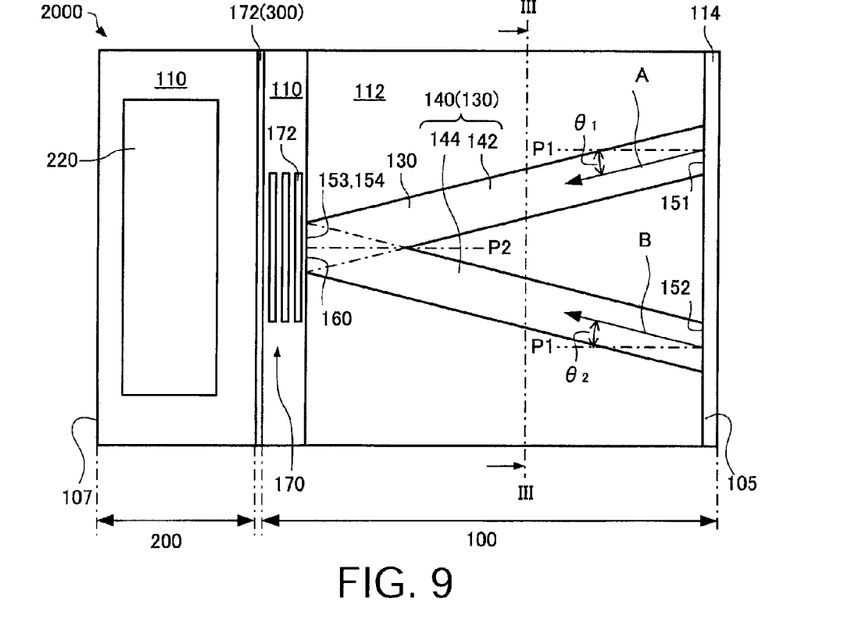
FIG. 9 is a schematic plan view of a light emitting and receiving device according to a first modified example of the embodiment.

FIG. 9 is a schematic plan view showing a light emitting and receiving device 2000 according to this modified example.

In the example of the light emitting and receiving device 1000, a case where the separation groove 300 is individually arranged on the side of the DBR 170 has been described. In contrast, in this modified example, the separation groove 300 may commonly be used as the DBR 170. In other words, the separation grooves 300 may be arranged similarly to the grooves 172, for example, a width a of $(2m_a+1)\lambda/(4n_a \cos \theta_1')$ and an interval b of $(2m+1)\lambda/(4n \cos \theta_1)$. The separation grooves 300 that are commonly used as the DBR 170 may be arranged to have a same width as that of the grooves 172 and have a same interval as that of the grooves 172. Alternatively, the separation grooves 300 may be arranged to have a width and an interval that are different from those of the grooves 172. Thus, for example, the width of the groove close to the light receiving area 200 side may be $(2m_a'+1)\lambda/(4n_a \cos\theta_1')$ that is greater than that of the grooves 172, that is, $m_a'>ma$. By applying this condition, the light receiving area 200 can more assuredly be electrically separated from the light emitting area 100.

(2) Next, a Second Modified Example will be Described.

Figure 10:
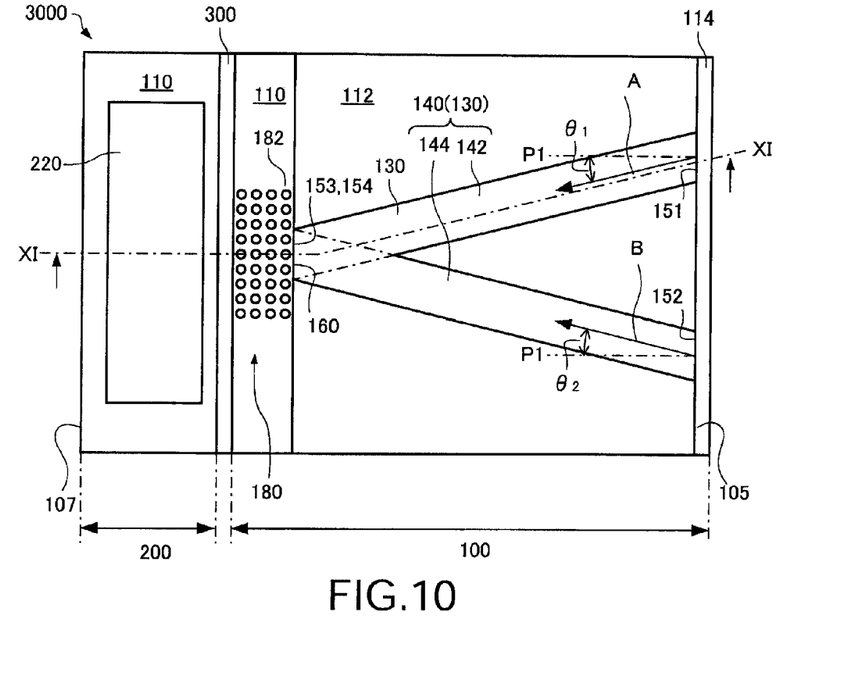
FIG. 10 is a schematic plan view of a light emitting and receiving device according to a second modified example of the embodiment.
Figure 11:
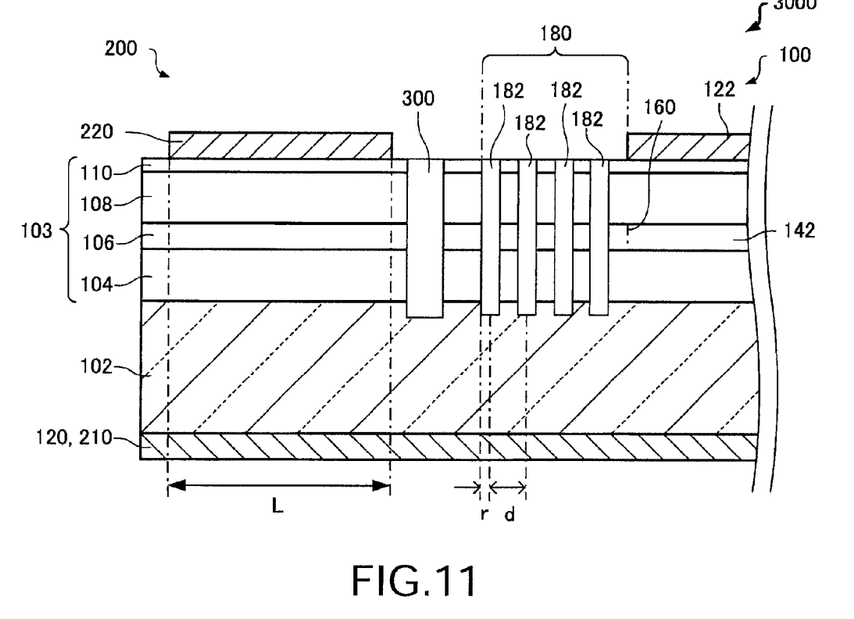
FIG. 11 is a schematic cross-sectional view of the light emitting and receiving device according to the second modified example.

FIG. 10 is a schematic plan view of a light emitting and receiving device 3000 according to this modified example. FIG. 11 is a cross-sectional view taken along line XI-XI shown in FIG. 10. The plan view shown in FIG. 10 corresponds to FIG. 2.

In the example of the light emitting and receiving device 1000, a case where the mirror portion is composed of the DBR 170 has been described. In contrast, in this modified example, the mirror portion may be composed of a photonic crystal region 180. The photonic crystal region 180 is composed of a plurality of holes 182 that is periodically arranged in a predetermined lattice constant in the in-plane direction of the active layer 106. In other words, the photonic crystal region 180 may have a two-dimensional photonic crystal structure in which periodical distributions of refractive indices are formed in the plane direction. The shape of the hole 182, for example, may be a cylinder shape. The planar shape of the hole 182, for example, may be a circle, an oval, a triangle, a rectangle, or the like. The position of the bottom surface of the hole 182 may be located below the position of the bottom surface of the active layer 106. In a case where a sufficient period is acquired, the position of the bottom surface of the hole 182 may be located above the position of the top surface of the active layer 106. In the example shown in the figure, a plurality of the holes 182 is arranged in an equal interval in a square lattice manner. The holes 182 may be arranged, for example, in a triangular lattice manner, a rectangular lattice manner, a honeycomb lattice manner, or the like. When the designed wavelength is 630 nm, the interval d of the holes 182, for example, may be about 231 nm, and the radius r of the opening of the hole 182, for example, may be about 134 nm. The photonic crystal region 180 may have a sufficient reflection band width even in a case where the photonic crystal region 180 is of a size that can be formed by using photolithographic technology (including interference exposure technique, liquid immersion exposure technique, or the like). The inside of the holes 182 may be hollow or may be filled up with an insulating material. The photonic crystal region, may have a periodical photonic crystal structure, a quasi-photonic crystal structure that has, for example, a quasi-periodic photonic crystal structure, a circular (polar) coordinate lattice structure, or the like. By arranging the photonic crystal region, the reflection surface 160 may have a high reflectivity.

The holes 182, for example, may be formed, for example, by using photolithographic technology, etching technology, or the like. Accordingly, the photonic crystal region 180 that is composed of the holes 182 can be formed.

According to this modified example, the photonic crystal region 180 can be arranged on the reflection surface 160, instead of the DBR 170. Accordingly, a light emitting and receiving device, similar to the above-described light emitting and receiving device 1000, that can reduce speckle noise and have a high output power can be realized.

(3) Next, a Third Modified Example will be Described.

Figure 12:
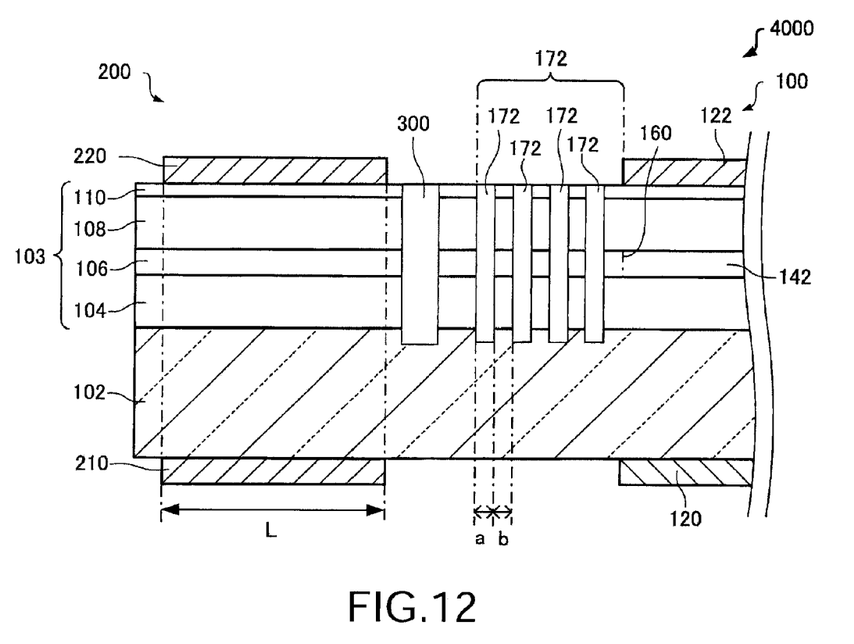
FIG. 12 is a schematic cross-sectional view of a light emitting and receiving device according to a third modified example of the embodiment.

FIG. 12 is a schematic cross-sectional view of a light emitting and receiving device 4000 according to this modified example.

In the example of the light emitting and receiving device 1000, a case where the first and the third electrode 120 and 210 are formed as a common electrode has been described. In contrast, in this modified example, the first electrode 120 and the third electrode 210 may be different from each other. According to this modified example, a light emitting and receiving device in which a light emitting device and a light receiving device can be independently driven can be provided.

(4) Next, a Fourth Modified Example will be Described.

Figure 13:
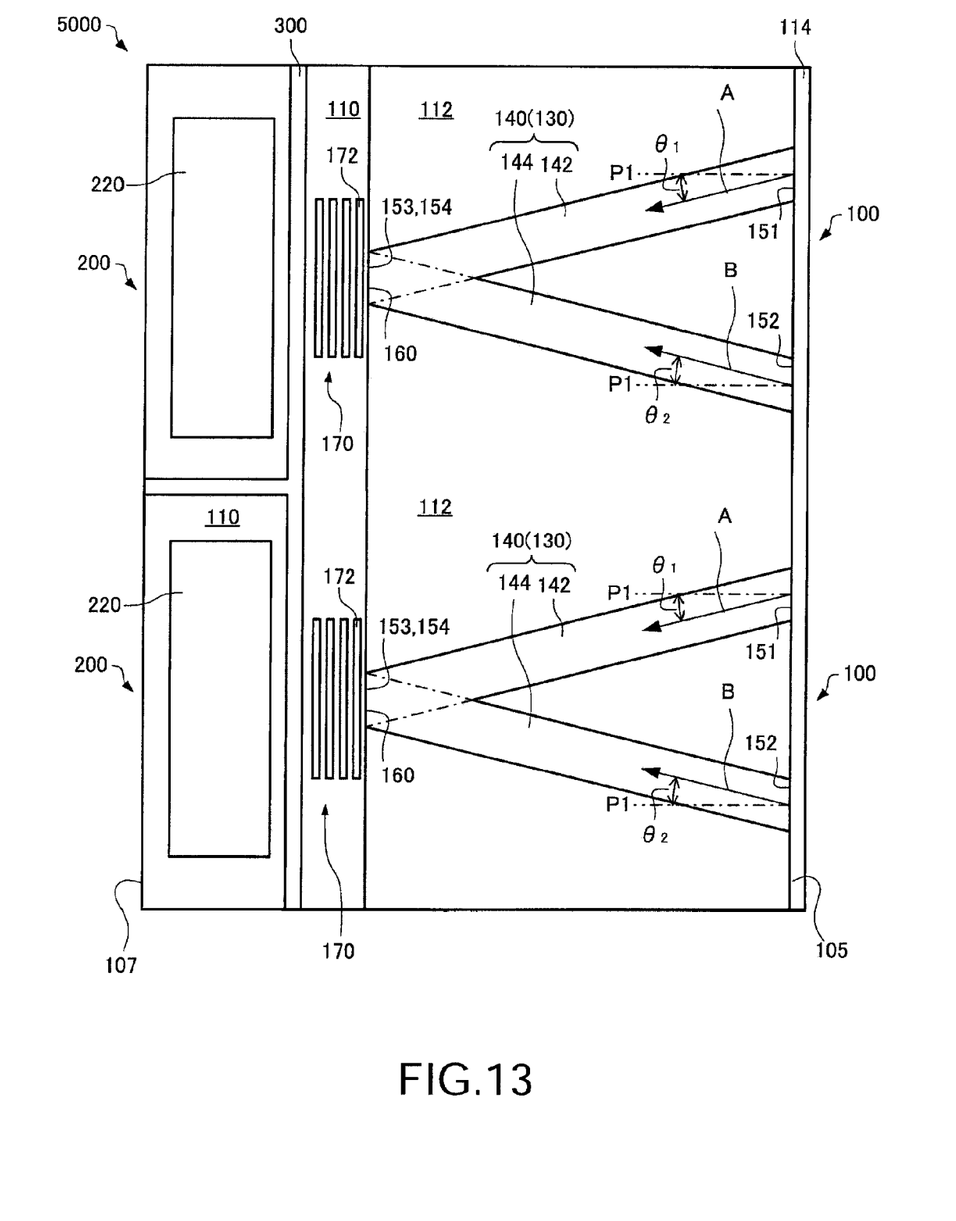
FIG. 13 is a schematic plan view of a light emitting and receiving device according to a fourth modified example of the embodiment.

FIG. 13 is a schematic plan view of a light emitting and receiving device 5000 according to this modified example. The plan view shown in FIG. 13 corresponds to FIG. 2.

In the example of the light emitting and receiving device 1000, a case where there is one pair of the light emitting area 100 and the light receiving area 200 has been described. In contrast, in this modified example, a plurality of the light emitting areas 100 and a plurality of the light receiving areas 200 may be arranged. On the side of each reflection surface 160 of the gain region 140, the DBR 170 may be disposed. Alternatively, instead of the DBR 170, a photonic crystal region 180 may be disposed. As described above, the DBR 170 and the photonic crystal region 180 can be formed in a planar process. Thus, for example, compared to case where formation of the dielectric mirror is performed for each chip after cleavage, an array can be formed more easily. As shown in FIG. 13, the light receiving area 200 may be arranged for each of a plurality of gain regions 140. Accordingly, the intensity of each light 14 that incidents to each light receiving area 200 can be detected individually. Although not shown in the figure, it is also possible that the number of the light emitting areas 100 is different from that of the light receiving areas 200. For example, one light receiving area 200 may be arranged in correspondence with a plurality of the light emitting areas 100. Such a configuration has advantages in that the total number of the light receiving elements is decreased and an external electronic circuit for adjusting the voltage of the light emitting device or the like can be simplified, in a case where the plurality of gain regions are alternately driven.

According to the light emitting and receiving device 5000 of this modified example, compared to the example of the light emitting and receiving device 1000, output power of the entire light emitting devices can become higher. In addition, according to the light emitting and receiving device 5000, each of the light 14 that incidents from each light emitting device 100 can be monitored.

(5) Next, a Fifth Modified Example will be Described.

Figure 14:
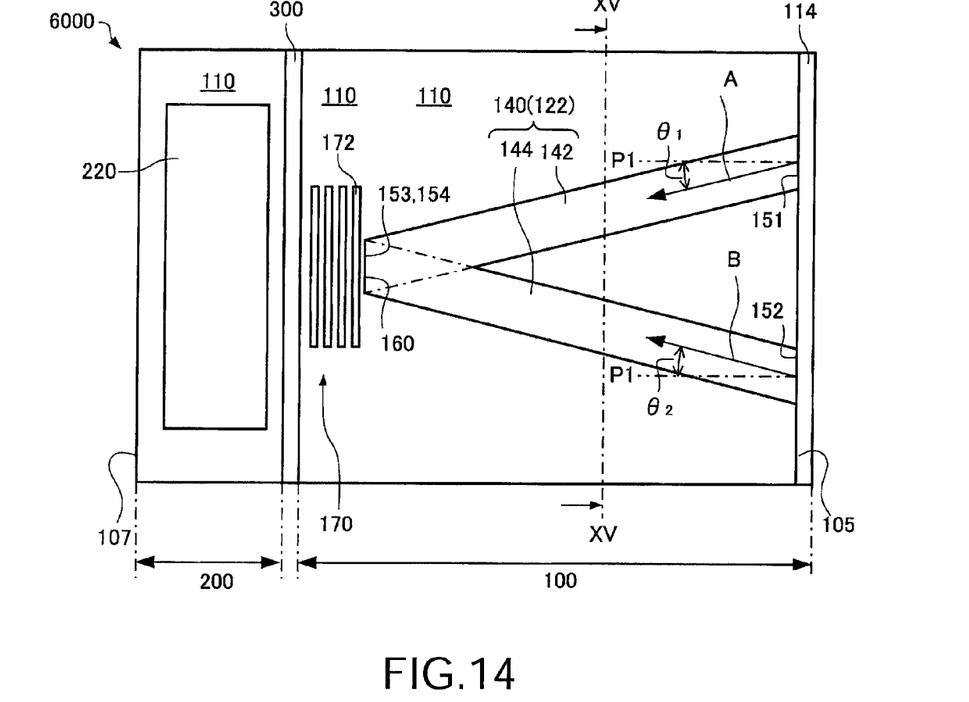
FIG. 14 is a schematic plan view of a light emitting and receiving device according to a fifth modified example of the embodiment.
Figure 15:
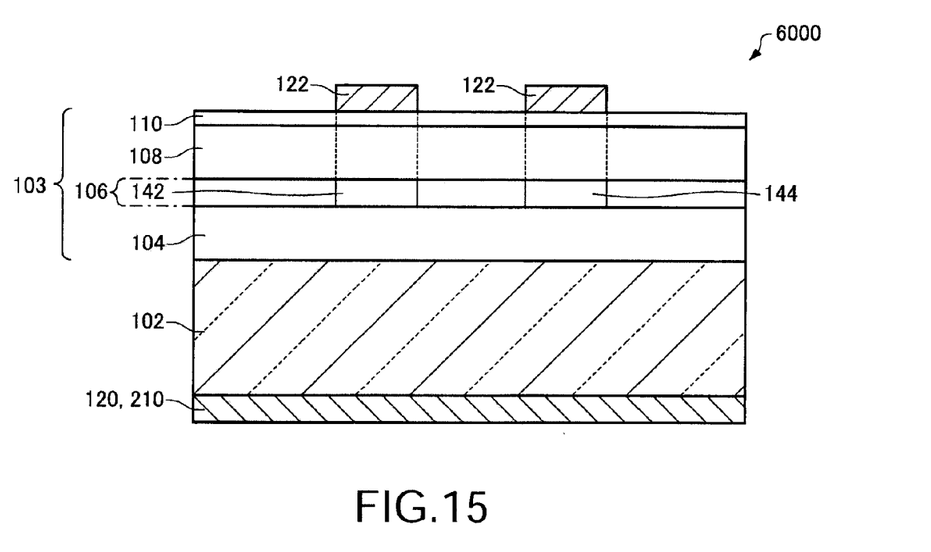
FIG. 15 is a schematic cross-sectional view of the light emitting and receiving device according to the fifth modified example.

FIG. 14 is a schematic plan view of a light emitting and receiving device 6000 according to this modified example. FIG. 15 is a cross-sectional view taken along line XV-XV shown in FIG. 14. The plan view shown in FIG. 14 corresponds to FIG. 2.

In the example of the light emitting and receiving device 1000, an index-guiding type waveguide structure in which light is confined by a refractive index difference has been described. In the example 1000, light is confined in an area in which the columnar region 130 is formed, that is, an area in which the insulating portion 112 is not formed, where the refractive index is higher than that in an area in which the insulating portion 112 is formed. In contrast, according to this modified example, a gain-guiding type waveguide structure in which the gain region 140 forms a waveguide area without introducing a refractive index difference can be used.

The second cladding layer 108 may be formed on the active layer 106. The contact layer 110 may be formed on the second cladding layer 108. As shown in FIG. 15, the second cladding layer 108 and the contact layer 110 do not form the columnar region 130.

The second electrode 122 is formed on the contact layer 110. The second electrode 122 is electrically connected to the second cladding layer 108 through the contact layer 110. As shown in FIG. 14, the lower surface of the second electrode 122 has the same planar shape as that of the gain region 140. In the example shown in the figure, a current path between the electrodes 120 and 122 is determined in accordance with the planar shape of the contact face of the second electrode 122 and the contact layer 110, and thus the planer shape of the gain region 140 can be determined. In the example shown in the figure, the upper surface and the lower surface of the second electrode 122 also have the same planar shape as that of the gain region 140.

According to this modified example, similarly to the above-described light emitting and receiving device 1000, a light emitting and receiving device that can reduce speckle noise and have a high output power can be realized.

(6) Next, a Sixth Modified Example will be Described.

Figure 16:
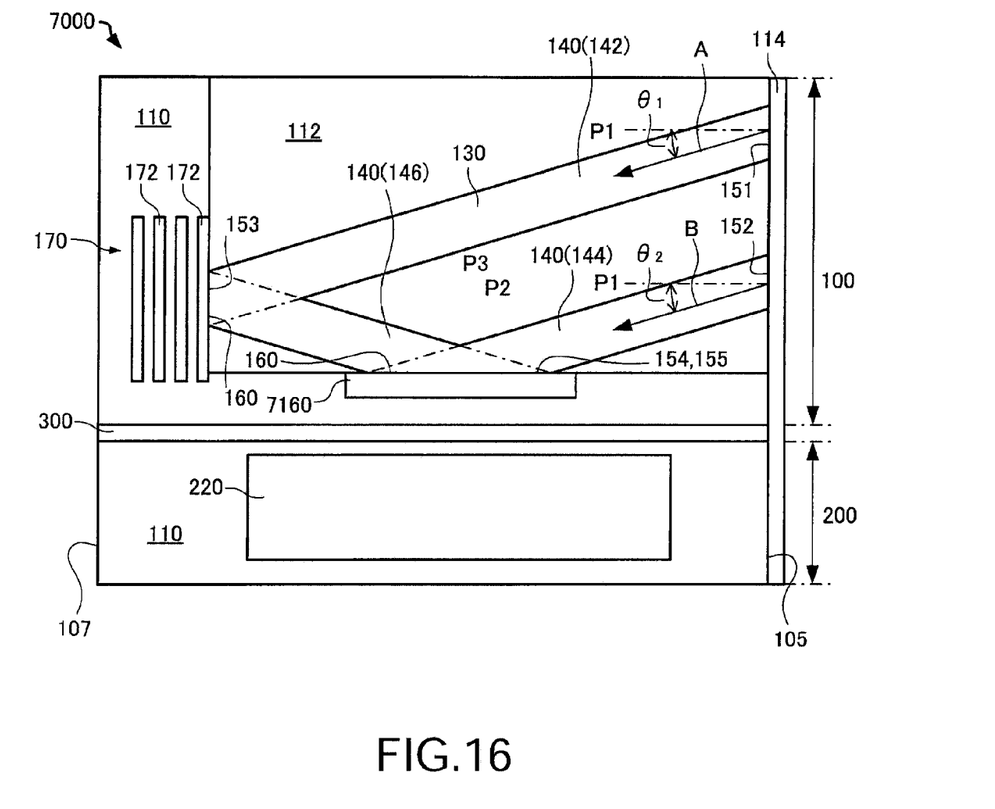
FIG. 16 is a schematic plan view of a light emitting and receiving device according to a sixth modified example of the embodiment.

FIG. 16 is a schematic plan view of a light emitting and receiving device 7000 according to this modified example.

In the example of the light emitting and receiving device 1000, a case where the mirror portion is the DBR 170 has been described. In contrast, in this modified example, the mirror portion may be on a side surface of an opening portion 7160 that exposes the reflection surface 160.

The opening portion 7160 may be disposed on the reflection surface 160 so that the light generated in the gain region 140 satisfies the total reflection condition, in other words, the light generated in the gain region 140 incidents with larger angle than the critical angle so as to be totally reflected. In the example shown in the figure, the light generated in the gain region 140 can be totally reflected at the reflection surface 160 that is composed of an end surface 155 of a third portion 146 that connects the first and second portions 142 and 144 of the gain region 140 and the fourth end surface 154 of the second portion 144.

The light receiving area 200 can be disposed on the side of the opening portion 7160 opposite to the reflection surface 160. The light receiving area 200 can receive light that is scattered on the reflection surface 160.

According to this modified example, similarly to the light emitting and receiving device 1000, a light emitting and receiving device in which the light emitting area and the light receiving area are monolithically formed can be provided.

(7) Next, a Seventh Modified Example will be Described.

In the example of the light emitting and receiving device 1000, a case where an AlInGaP system is used has been described. However, in this modified example, all the other material systems with which the gain region can be formed can be used. As the semiconductor material, for example, a semiconductor material such as an AlGaN system, a GaN system, an InGaN system, a GaP system, an AlGaAs system, a GaAs system, an InGaAs system, a GaInNAs system, or a ZnCdSe system may be used. In this modified example, as the substrate 102, for example, a GaN substrate, a GaAs substrate, a Si substrate, a sapphire substrate or the like may be used. In this modified example, for example, an organic material or the like may also be used.

The above described modified examples are only examples, and the invention is not limited to them. For example, the modified examples may be appropriately combined together.

4. The embodiments of the invention have been described in detail as described above. However, it is apparent to those skilled in the art that various changes can be made without substantially departing from noble matters and advantages of the invention. Accordingly, such all the modified examples belong to the scope of the invention.

What is claimed is:

1. A light emitting and receiving device comprising:
   a semiconductor layer including:
      a first cladding layer;
      an active layer that is formed on an upper side of the first cladding layer; and
      a second cladding layer that is formed on an upper side of the active layer,
   a separation groove that electrically separates the semiconductor layer into a light emitting area and a light receiving area;
   a gain region that is formed in at least a part of the active layer that is located in the light emitting area, and the gain region is a continuous region extending from a first end surface disposed on a first side surface of the active layer that is located in the light emitting area to a second end surface disposed on the first side surface;
   a reflection surface that is formed at the gain region and that reflects light generated in the gain region between the first end surface and the second end surface;
   a mirror portion that is arranged on the reflection surface;
   a first electrode that is electrically connected to the first cladding layer located in the light emitting area;
   a second electrode that is electrically connected to the second cladding layer located in the light emitting area;
   a third electrode that is electrically connected to the first cladding layer located in the light receiving area;
   a fourth electrode that is electrically connected to the second cladding layer located in the light receiving area; and
   a second side surface that is located at an end of the light receiving area, that faces away from the separation groove, and that is opposite to the first side surface, wherein
   each of a first portion of the gain region that extends from the first end surface and a second portion of the gain region that extends from the second end surface is disposed in a direction tilted with respect to a perpendicular line of the first side surface in the plan view,
   a part of light generated in the first portion of the gain region is reflected by the reflection surface so as to be emitted from the second end surface,
   a part of light generated in the second portion of the gain region is reflected by the reflection surface so as to be emitted from the first end surface,
   a part of the light generated in the gain region transmits through the mirror portion arranged on the reflection surface,
   the light transmitting through the mirror portion is received in the light receiving area of the semiconductor layer, and
   a length that corresponds to a distance between the separation groove and the second side surface is $(2m_c+1)\lambda/4n_c$, where $m_c$ is an integer equal to or greater than zero, $\lambda$ is a wavelength of the light generated in the gain region, and $n_c$ is an effective refractive index of a vertical section of the light receiving area.

2. The light emitting and receiving device according to claim 1, wherein the mirror portion is formed by a distributed Bragg reflector or a photonic crystal region.

3. The light emitting and receiving device according to claim 2,
wherein the distributed Bragg reflector is composed of a plurality of grooves, and
the plurality of grooves are disposed at a predetermined interval in the perpendicular direction.

4. The light emitting and receiving device according to claim 3, wherein at least one of the plurality of grooves also works as the separation groove.

5. The light emitting and receiving device according to claim 2, wherein the photonic crystal region is formed by a plurality of holes that are periodically arranged in a predetermined lattice constant in an in-plane direction of the active layer.

6. The light emitting and receiving device according to claim 1,
wherein the first portion of the gain region is disposed from the first end surface to the reflection surface in a first direction,
the second portion of the gain region is disposed from the second end surface to the reflection surface in a second direction different from the first direction, and
a third end surface of the first portion and a fourth end surface of the second portion overlap each other on the reflection surface.

7. The light emitting and receiving device according to claim 6, wherein the first end surface of the first portion and the second end surface of the second portion do not overlap with the second and third end surfaces, respectively, in the perpendicular direction.

8. The light emitting and receiving device according to claim 1,
wherein the separation groove is disposed between the light emitting area and the light receiving area in the plan view, and
a bottom surface of the separation groove is located below a bottom surface of the active layer.

9. The light emitting and receiving device according to claim 1, wherein the first electrode and the third electrode are a common electrode.

10. The light emitting and receiving device according to claim 1, wherein a plurality of the light emitting areas and a plurality of the light receiving areas are arranged.

11. The light emitting and receiving device according to claim 1, wherein a plurality of the light emitting areas are arranged, and the total number of the light receiving area arranged is a measure of that of the light emitting areas.

12. The light emitting and receiving device according to claim 11, wherein a plurality of the light emitting areas are arranged, and a single one of the light receiving area is arranged.

13. A light emitting and receiving device comprising:
a semiconductor layer including:
an active layer formed between a first cladding layer and a second cladding layer, and
an insulating part regulating the current flow;
a separation groove that electrically separates the semiconductor layer into a light emitting area and a receiving area;
a current route that is formed in at least a part of the active layer, that is defined by electric current flowing from the first cladding layer to the second cladding layer through the active layer except the insulating part, and that includes a first portion, a second portion, and a reflection surface;
a mirror portion that is arranged on the reflection surface;
a first electrode that is electrically connected to the first cladding layer located in the light emitting area;
a second electrode that is electrically connected to the second cladding layer located in the light emitting area;
a third electrode that is electrically connected to the first cladding layer located in the light receiving area;
a fourth electrode that is electrically connected to the second cladding layer located in the light receiving area; and
a second side surface that is located at an end of the light receiving area, that faces away from the separation groove, and that is opposite to the first side surface, wherein
the first portion extends from a first end surface disposed on a first side surface of the active layer to the reflection surface,
the second portion extends from a second end surface disposed on the first side surface of the active layer to the reflection surface,
a part of light generated in the first portion is reflected by the reflection surface so as to be emitted from the second end surface through the second portion,
a part of light generated in the second portion is reflected by the reflection surface so as to be emitted from the first end surface through the first portion,
a part of the light generated in the both of the first portion and the second portion is transmitted through the mirror portion,
the light transmitting through the mirror portion is received in the light receiving area of the semiconductor layer, and
a length that corresponds to a distance between the separation groove and the second side surface is $(2m_c+1)\lambda/4n_c$, where $m_c$ is an integer equal to or greater than zero, $\lambda$ is a wavelength of the light generated in the gain region, and $n_c$ is an effective refractive index of a vertical section of the light receiving area.

14. The light emitting and receiving device according to claim 13, wherein the mirror portion is formed by a distributed Bragg reflector or a photonic crystal region.

15. The light emitting and receiving device according to claim 14,
wherein the distributed Bragg reflector is composed of a plurality of grooves, and
the plurality of grooves are disposed at a predetermined interval in the perpendicular direction.

* * * * *